(12) United States Patent
McKenzie et al.

(10) Patent No.: US 10,790,790 B2
(45) Date of Patent: Sep. 29, 2020

(54) AMPLIFIERS WITH DELTA-SIGMA MODULATORS USING PULSE-DENSITY MODULATIONS AND RELATED PROCESSES

(71) Applicant: KAPIK INC., Toronto (CA)

(72) Inventors: Robert Neil McKenzie, Toronto (CA); William Martin Snelgrove, Toronto (CA); Wai Tung Ng, Thornhill (CA)

(73) Assignee: KAPIK INC., Toronto (CA)

( * ) Notice: Subject to any disclaimer, the term of this patent is extended or adjusted under 35 U.S.C. 154(b) by 152 days.

(21) Appl. No.: 15/873,532

(22) Filed: Jan. 17, 2018

(65) Prior Publication Data
US 2018/0205352 A1   Jul. 19, 2018

Related U.S. Application Data

(60) Provisional application No. 62/447,022, filed on Jan. 17, 2017.

(51) Int. Cl.
*H03F 3/217*   (2006.01)
*H03F 1/06*    (2006.01)
(Continued)

(52) U.S. Cl.
CPC ........... *H03F 3/2171* (2013.01); *G06F 7/602* (2013.01); *H03F 1/06* (2013.01); *H03F 3/185* (2013.01);
(Continued)

(58) Field of Classification Search
CPC ......... H03K 7/08; H03F 3/2173; H03F 99/00; H03F 3/2171; H03F 1/06; H03F 3/24;
(Continued)

(56) References Cited

U.S. PATENT DOCUMENTS

| 2007/0083277 | A1* | 4/2007 | Mallinson | H03M 7/302 700/94 |
| 2011/0006938 | A1* | 1/2011 | Ihs | H03F 3/2175 341/143 |
| 2012/0237060 | A1* | 9/2012 | Cho | H03F 3/217 381/121 |

FOREIGN PATENT DOCUMENTS

EP   1406381 A1 *   4/2004   ........... H03F 3/2175

OTHER PUBLICATIONS

Trehan, C., and K. S. Chao. "A high performance class-D power amplifier using error feedback architecture." Circuits and Systems, 2005. 48th Midwest Symposium on. IEEE, 2005.

* cited by examiner

*Primary Examiner* — Arnold M Kinkead
(74) *Attorney, Agent, or Firm* — Perry + Currier Inc.

(57) ABSTRACT

An audio amplifier system includes a delta-sigma modulator configured to receive an m-bit digital audio input signal and to generate a pulse density modulated signal based on the m-bit digital audio input signal. An analog power stage is coupled to the delta-sigma modulator to receive the pulse density modulated signal and amplify the pulse density modulated signal to generate an amplified pulse density modulated signal. A feedback circuit is coupled to the delta-sigma modulator and the analog power stage. The feedback circuit is configured to receive the amplified pulse density modulated signal and the pulse density modulated signal and to determine a digital error signal representative of a difference between the amplified pulse density modulated signal and the pulse density modulated signal. The feedback circuit is further configured to provide the digital error signal to the delta-sigma modulator for applying the digital error signal to a representation of the m-bit digital audio input signal.

25 Claims, 9 Drawing Sheets

(51) Int. Cl.
*H03F 3/24* (2006.01)
*H03L 7/081* (2006.01)
*G06F 7/60* (2006.01)
*H03M 7/32* (2006.01)
*H04B 14/06* (2006.01)
*H04L 27/36* (2006.01)
*H03M 3/02* (2006.01)
*H03F 3/185* (2006.01)
*H03M 3/00* (2006.01)

(52) U.S. Cl.
CPC ............. *H03F 3/2173* (2013.01); *H03F 3/24* (2013.01); *H03L 7/0816* (2013.01); *H03M 3/02* (2013.01); *H03M 3/502* (2013.01); *H03M 7/3011* (2013.01); *H03M 7/3015* (2013.01); *H04B 14/062* (2013.01); *H04L 27/36* (2013.01); *H03F 2200/03* (2013.01); *H03F 2200/331* (2013.01)

(58) Field of Classification Search
CPC ................. H03F 3/185; H03F 2200/03; H03F 2200/331; H03M 3/456; H03M 3/50; H03M 3/432; H03M 7/3011; H03M 7/3015; H03M 3/02; H03M 3/502; H03L 7/0816; H04L 27/36; H04B 14/062
USPC ............ 381/120, 121; 341/143; 330/10, 251
See application file for complete search history.

AMPLIFIERS WITH DELTA-SIGMA MODULATORS USING PULSE-DENSITY MODULATIONS AND RELATED PROCESSES

FIELD

The present invention relates to amplifiers.

BACKGROUND

Amplifiers such as those used in audio application come in a variety of designs and types.

Class AB amplifiers are generally linear and have low distortion. However, power efficiency is typically low.

Class D amplifiers generally have better power efficiency and are better suited to full digital implementations. Class D amplifiers have been implemented with pulse-width modulation (PWM) techniques and pulse-density modulation (PDM) techniques. Fully digital Class D implementations have been done with pulse-width modulation (PWM) and pulse-density modulation (PDM) architectures.

Digital implementations of class D PWM amplifiers typically require a very high speed clock for edge resolution. Class D PWM amplifiers generate electromagnetic noise, and typically generate larger amounts at harmonics of the ramp and switching frequency. Class D PWM amplifiers are commonly used, with EM noise being tolerated or reduced using a variety of schemes.

Class D PDM amplifiers typically use noise shaping to reduce noise in the audio band. This type of amplifier implemented with higher-order delta-sigma modulators can provide better noise attenuation at a cost of reduced output range. In addition, EM noise is generally reduced due to the output bit stream being more dispersed, in that there is a lower concentration of EM energy at important EM bands (e.g., carrier bands) and their harmonics. In particular, PWM generally has a high concentration of EM energy in the carrier (switching frequency) band, and its harmonics. Unlike PWM, PDM does not have a fixed switching frequency, and therefore has a lower overall concentration of EM energy in that frequency range.

A critical drawback of class D PDM amplifiers is low output quality relative to linear amplifiers, such as Class AB.

With reference to FIG. 1, an ideal implementation of a class D PDM amplifier includes a digital modulator, an analog power stage, and a low-pass filter to attenuate high-frequency quantization noise. The analog power stage is a significant non-ideal component of the signal chain. Output of the analog power stage, waveform v1(t), can differ from the ideal waveform v(t), i.e., the output of the digital modulator, due to supply noise, power device parasitics, power device on-resistance, dead times, and other factors. These non-idealities can raise the noise floor and introduce harmonic distortion and/or supply components to the output signal. As such, the analog power stage of a class D amplifier can add audible non-idealities to the signal, which can be a significant performance disadvantage in an open loop PWM or PDM class D amplifier.

SUMMARY

According to one aspect of the present invention, an audio amplifier system includes a delta-sigma modulator configured to receive an m-bit digital audio input signal and to generate a pulse density modulated signal based on the m-bit digital audio input signal. An analog power stage is coupled to the delta-sigma modulator to receive the pulse density modulated signal and amplify the pulse density modulated signal to generate an amplified pulse density modulated signal. A feedback circuit is coupled to the delta-sigma modulator and the analog power stage. The feedback circuit is configured to receive the amplified pulse density modulated signal and the pulse density modulated signal and to determine a digital error signal representative of a difference between the amplified pulse density modulated signal and the pulse density modulated signal. The feedback circuit is further configured to provide the digital error signal to the delta-sigma modulator for applying the digital error signal to a representation of the m-bit digital audio input signal. The feedback circuit is configured to perform a transfer function on the difference between the amplified pulse density modulated signal and the pulse density modulated signal and to convert a resulting difference into a digital signal so as to obtain the digital error signal.

According to another aspect of the present invention, an audio amplifier system includes a delta-sigma modulator configured to receive an m-bit digital audio input signal and to generate a pulse density modulated signal based on the m-bit digital audio input signal. An analog power stage is coupled to the delta-sigma modulator to receive the pulse density modulated signal and amplify the pulse density modulated signal to generate an amplified pulse density modulated signal. A feedback circuit is coupled to the delta-sigma modulator and the analog power stage. The feedback circuit is configured to receive the amplified pulse density modulated signal and the pulse density modulated signal and to determine a digital error signal representative of a difference between the amplified pulse density modulated signal and the pulse density modulated signal. The feedback circuit is further configured to provide the digital error signal to the delta-sigma modulator for applying the digital error signal to a representation of the m-bit digital audio input signal. The feedback circuit is further configured to perform a transfer function on the amplified pulse density modulated signal.

According to another aspect of the present invention, an audio amplifier system includes a delta-sigma modulator configured to receive an m-bit digital audio input signal and to generate a pulse density modulated signal based on the m-bit digital audio input signal. An analog power stage is coupled to the delta-sigma modulator to receive the pulse density modulated signal and amplify the pulse density modulated signal to generate an amplified pulse density modulated signal. A feedback circuit is coupled to the delta-sigma modulator and the analog power stage. The feedback circuit is configured to receive the amplified pulse density modulated signal and the pulse density modulated signal and to determine a digital error signal representative of a difference between the amplified pulse density modulated signal and the pulse density modulated signal. The feedback circuit is further configured to provide the digital error signal to the delta-sigma modulator for applying the digital error signal to a representation of the m-bit digital audio input signal. The feedback circuit is further configured to perform a transfer function on the pulse density modulated signal According to another aspect of the present invention, a process for amplifying an m-bit digital audio input signal includes using a delta-sigma modulator to generate a pulse density modulated signal based on the m-bit digital audio input signal, including applying a digital error signal to a representation of the m-bit digital audio input signal. The process further includes amplifying the pulse density modulated signal to generate an amplified pulse density modulated signal, determining the digital error signal by applying a transfer function to a difference between the amplified pulse density modulated signal and the pulse density modulated signal, and providing the digital error signal to the delta-sigma modulator in a feedback path.

BRIEF DESCRIPTION OF THE DRAWINGS

The drawings illustrate, by way of example only, embodiments of the present invention.

DETAILED DESCRIPTION

The present invention provides amplifiers, processes, and related techniques to solve at least one of the problems discussed above.

Figure 1:
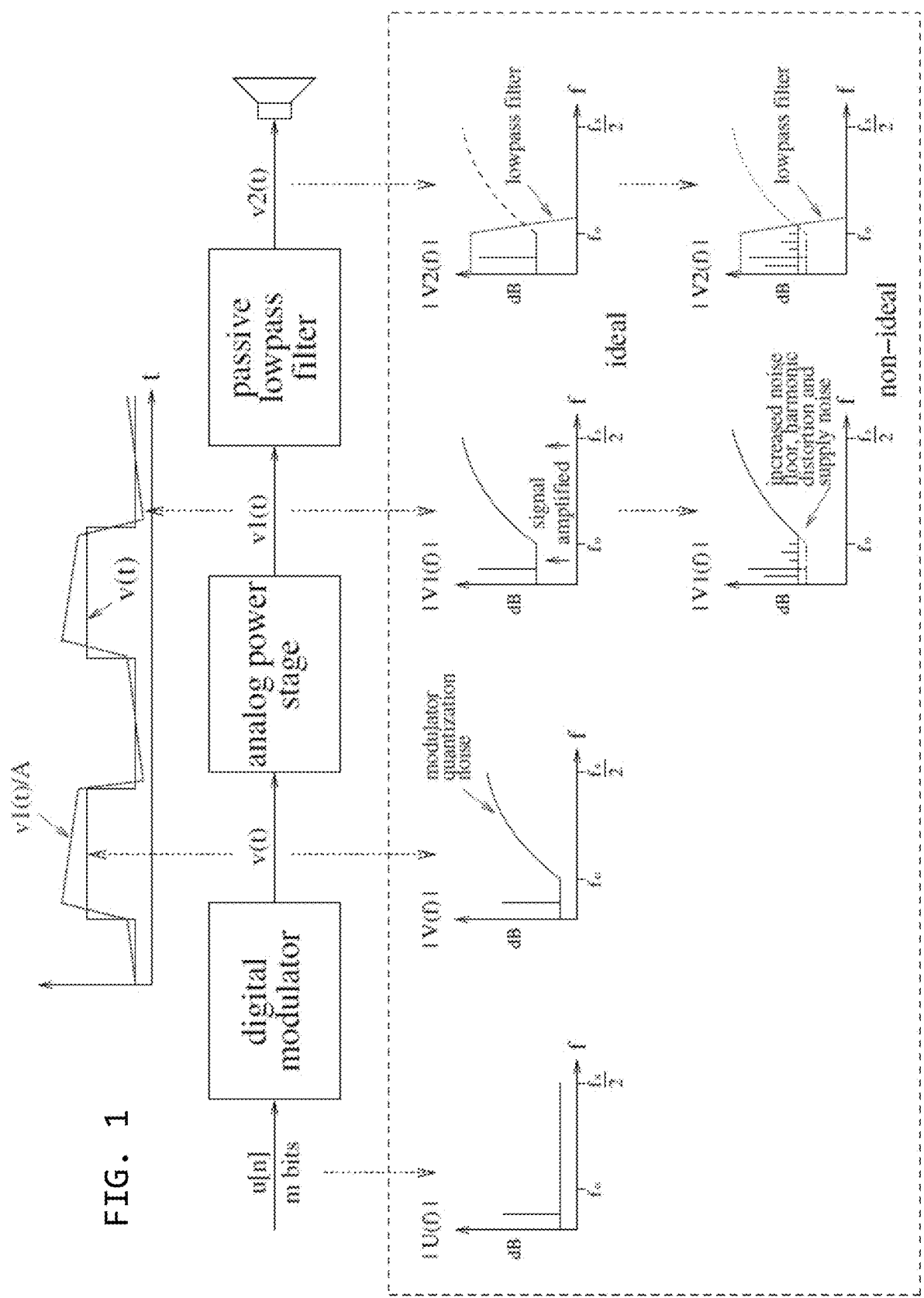
FIG. 1 is a schematic diagram of ideal vs. non-ideal characteristics of an amplifier system applying pulse-density modulation techniques.
Figure 2:
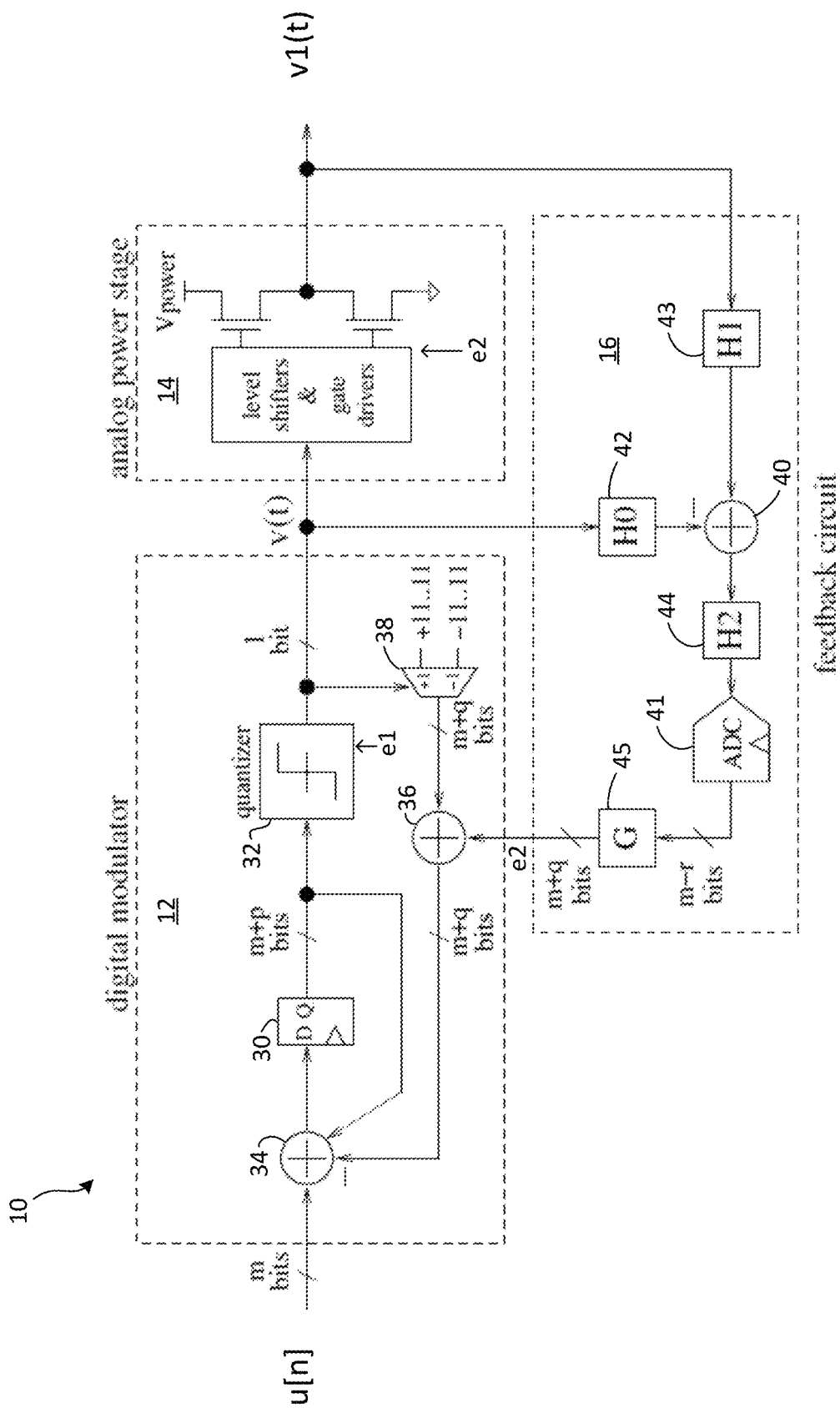
FIG. 2 is a schematic diagram of an amplifier system according to the present invention.

With reference to FIG. 2, an amplifier system 10 according to the present invention includes a delta-sigma modulator 12, a power stage 14, and a feedback circuit 16. The amplifier system 10 operates on an input signal, u[n], to generate an amplified signal, v1(t). The amplifier system 10 may be considered a class D audio amplifier system. The feedback circuit 16 provides digitized feedback that efficiently improves the quality of the signal v1(t). Advantageously, the digitized feedback is configured as an error that can have a bit width (bit depth) that is less than the bit width of the modulated signal, so that the digitization in the feedback path can be achieved with a lower resolution converter that requires less power.

Figure 4:
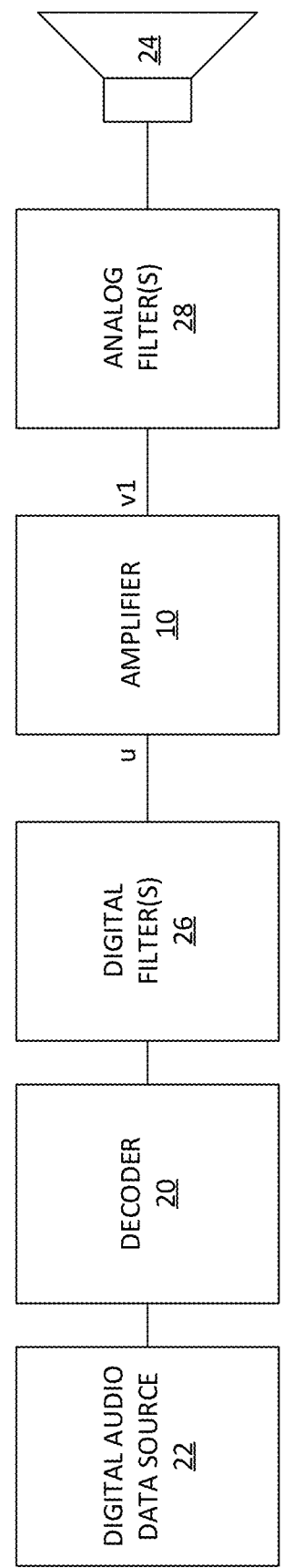
FIG. 4 is an example of an output side of digital audio architecture or codec.

In one example, as shown in FIG. 4, the input signal u is a digital audio input signal provided by a decoder 20 that decodes (and/or decompresses) digital audio data source 22 for output at a speaker 24 or similar analog output device. The digital audio data source 22 can be a device such as a storage disk, memory, a processor, a digital microphone, and the like. Various digital filters 26 may be provided for the decoded signal. Various analog filters 28, such as a low-pass filter, may be implemented after v1(t) in the signal chain. Numerous other architectures/codecs are also suitable for use with the present invention, including those that include one or more analog-to-digital converters (ADC) for handling input from, for example, a microphone. Various components of the system, such as the amplifier system 10 and analog filter 28, can be multiplied in parallel signal paths to drive multiple channels/speakers.

Referring back to FIG. 2, the delta-sigma modulator 12 is a digital-to-analog converter (DAC) that includes a register 30 and a quantizer 32 configured for pulse density modulation. In this example, the delta-sigma modulator 12 is a first-order modulator. However, this is not limiting and the delta-sigma modulator 12 can be of any suitable order. The delta-sigma modulator 12 further includes an input node 34 to which the input signal u is applied. The input node 34 is includes an adder that is also used for combining the input signal u with feedback signal(s). The register 30 and input node (adder) 34 cooperate as an integrator. The delta-sigma modulator 12 generates a pulse density modulated signal, v(t), based on the input signal u, with an error, e1, representing the error introduced by quantization.

The power stage 14 is coupled to the output of the delta-sigma modulator 12 and receives the pulse density modulated signal v(t) from the delta-sigma modulator 12. The power stage 14 amplifies the modulated signal v(t) to generate the signal v1(t).

The feedback circuit 16 is coupled to the delta-sigma modulator 12 and the power stage 14 to receive both the signal v1(t) and the pulse density modulated signal v(t). The feedback circuit 16 is configured to determine a digital error signal, e2, representative of a difference between the signal v1(t) and the modulated signal v(t). That is, the feedback circuit 16 includes a difference node 40 that takes a measurement of error signal e2 by subtracting the modulated signal v(t) from the signal v1(t). Advantageously, the digital error signal e2 can be represented with a bit width lower than the bit width of the full scale audio signal. That is, if the delta-sigma modulator 12 operates on 16-bit signals, then the digital error signal e2 can be represented with fewer than 16 bits. The feedback circuit 16 provides the digital error signal e2 to the delta-sigma modulator 12, so that the digital error signal e2 can be applied as feedback to the input signal u.

The feedback circuit 16 includes an ADC 41 located downstream of the difference node 40 and configured to digitize the difference between the power stage output signal v1(t) and the modulated signal v(t) to provide the digital error signal e2. Accordingly, the ADC 41 can be of lower bit width than the bit width of the full scale audio signal.

The feedback circuit 16 can include an H0 block 42 located between the output of the modulator 12 and the difference node 40. The H0 block 42 can be configured to perform a transfer function on the modulated signal v(t). The transfer function can be configured to scale the signal (e.g., multiply or divide by a scalar), cut off high frequency components (e.g., implement a low pass filter), or perform a combination of such. The H0 block 42 can be configured to perform a transfer function of "1", and leave the signal unchanged from input to output. The H0 block 42 can be omitted, which effectively provides a transfer function of "1".

The feedback circuit 16 can include an H1 block 43 located between the output of the power stage 14 and the difference node 40. The H1 block 43 can be configured to perform a transfer function on the analog signal v1(t). The transfer function can be configured to divide the signal v1(t) to be the same level as the reference node (output of the modulator 12). For example, if Vpower is 10V and the reference node is at 3.3V, the H1 block 43 can be configured to scale the signal v1 by ⅓. Alternatively or additionally, the transfer function can be configured to remove high frequency components in the signal v1(t) (e.g., implement a low pass filter). The H1 block 43 can be configured to perform a transfer function of "1", and leave the signal unchanged from input to output. The H1 block 43 can be omitted, which effectively provides a transfer function of "1".

The feedback circuit 16 includes an H2 block 44 located between the difference node 40 and the ADC 41. The H2 block 44 can be configured to perform a transfer function on the difference signal between the switching node (output of the analog power stage 14) and the reference node (output of the modulator 12). This transfer function can include an integration (e.g., H2=1/s), provide scaling, or perform a combination of such. The H2 block 44 can be configured to reset the output to "0" after the output is sampled by the ADC 41.

The feedback circuit 16 includes a G block 45 at the output of the ADC 41. The G block 45 can be configured to scale the output code of the ADC 41 to match the appropriate magnitude required in the modulator 12, and additionally to perform any digital processing necessary on the feedback circuit (such as filtering, up or down-sampling) as required. As such, the G block 45 can implement a scaling transfer function or similar.

The delta-sigma modulator 12 further includes a feedback node 36 at which the digital error signal e2 is received. The feedback node 36 combines the digital error signal e2 with the modulated signal v(t) and provides the resulting signal to the input node 34, so as to compensate the input signal u for non-ideal performance from the power stage 14. A multiplexer 38 can be provided to generate a full-scale representation of the pulse density modulated signal v(t) for combination with the digital error signal e2 at the feedback node 36. That is, the error signal e2 is combined with the output of the multiplexer 38, which is a full-scale representation of signal v(t).

As shown in FIG. 2, the digital input signal u[n] is m bits, the internal state of the modulator 12 is m+p bits (where p>=0), the full-scale representation of the pulse density modulated signal v(t) is m+q bits (where q>=0, e.g., q=p), and the digitized feedback signal is m-r bits (where r>0). Advantageously, lower bit resolution in the feedback means a lower resolution, and lower power ADC can be used.

Figure 3:
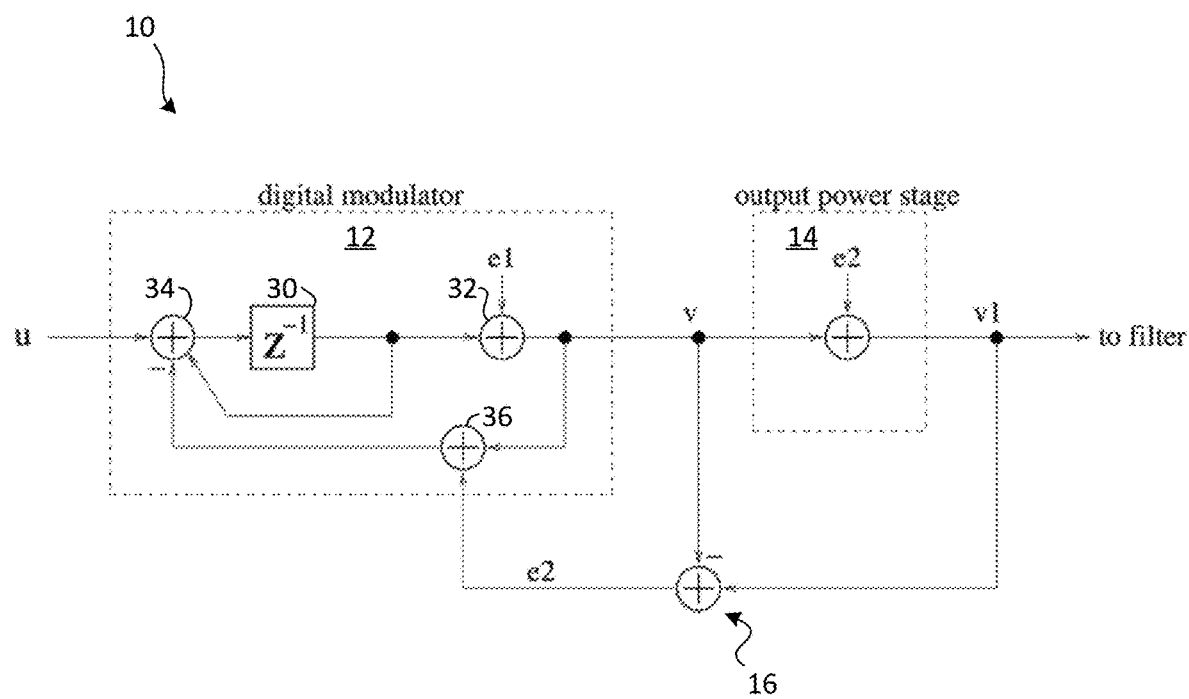
FIG. 3 is a schematic diagram of the amplifier system of FIG. 2, generalized.

With reference to a generalized representation of the amplifier system 10 shown in FIG. 3, the discrete time transfer function of the modulator output is as follows:

$$v[n]=z^{-1}u[n]+(1-z^{-1})e1[n]-(z^{-1})e2[n]$$

The discrete time transfer function of the power stage output is as follows:

$$v1[n]=(v[n]+e2[n])=z^{-1}u[n]+(1-z^{-1})e1[n]+(1-z^{-1})e2[n]$$

This results in a signal transfer function (STF) of $z^{-1}$ and noise transfer functions (NTF) of $1-z^{-1}$ for each of quantization and the power stage.

Figure 5:
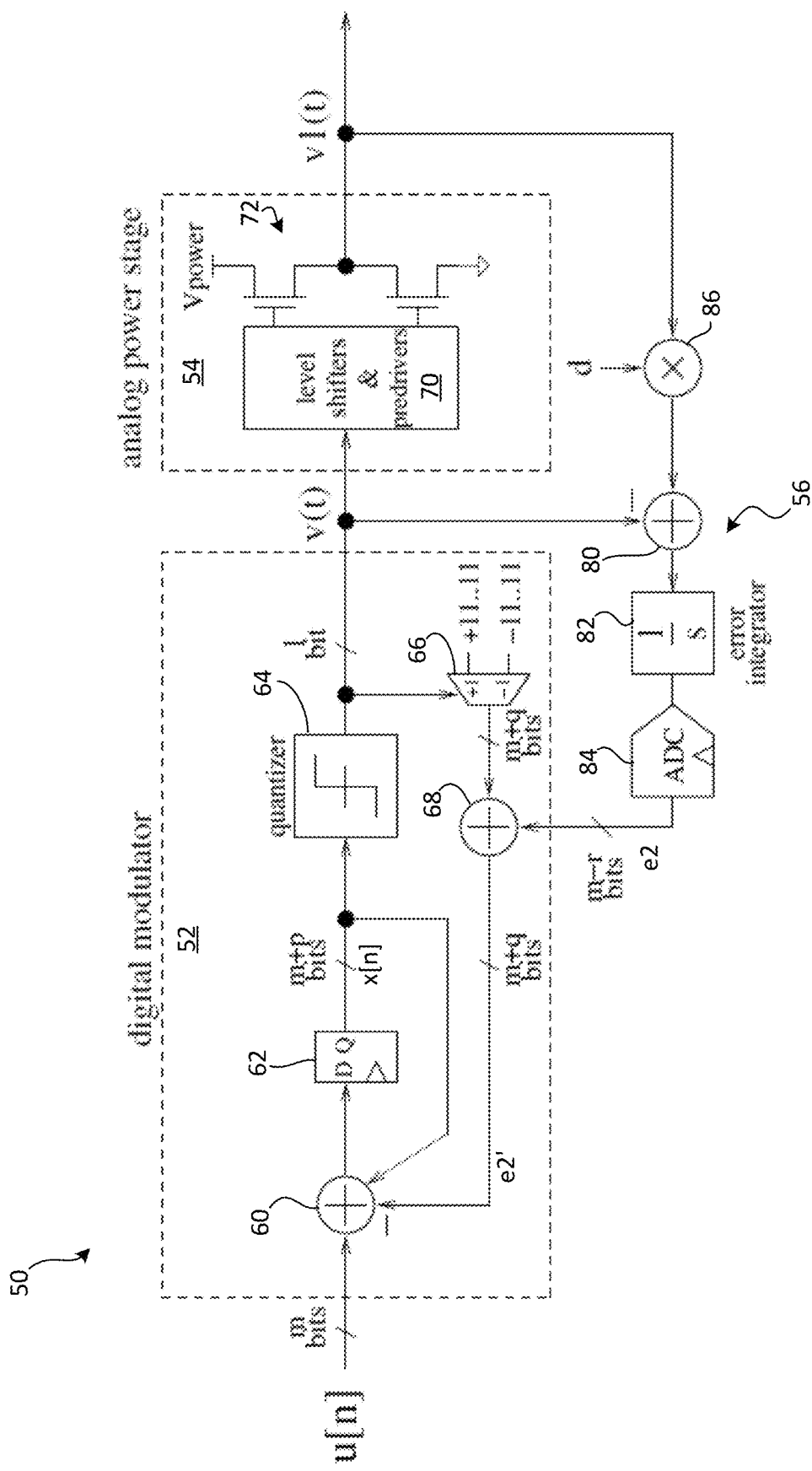
FIG. 5 is a block diagram of another amplifier system according to the present invention.

FIG. 5 shows another amplifier system 50 according to the present invention. The amplifier system 50 is similar to the amplifier system 10 and the above description may be referenced, with like reference numerals denoting like components. The amplifier system 50 may be used as the amplifier system 10 in the audio system of FIG. 4 and may be considered a class D audio amplifier system. Numerous other uses for the amplifier system 50 are contemplated.

The amplifier system 50 includes a delta-sigma modulator 52, an analog power stage 54, and a feedback circuit 56. The amplifier system 50 operates on an m-bit digital input signal, u[n], to generate and output an analog signal, v1(t). The feedback circuit 56 provides digitized feedback that efficiently improves the quality of the signal v1(t). Advantageously, the digitized feedback is configured as an error that will typically have a magnitude much lower than that of the modulated signal, so that digitization of the feedback error can be performed with a much lower resolution analog to digital converter, and thereby consume less overall power.

The delta-sigma modulator 52 includes an input node 60, a register 62, and a quantizer 64 configured for pulse density modulation. The input node 60 receives the m-bit digital input signal u[n] and applies to the input signal u[n], as feedback, an internal state, x[n], and a full-scale representation, e2', of the quantized output (i.e., the pulse density modulated signal) plus the error originating from the feedback circuit 56. In this example, the delta-sigma modulator 52 is a first-order modulator. However, this is not limiting and the delta-sigma modulator 52 can be of any suitable order.

The latch 62 latches the compensated signal generated by the input node 60 to obtain the internal state x[n], which is m+p bits, where p>=0. The internal state x[n] is quantized by the quantizer 64 to obtain a pulse density modulated signal, v(t).

The delta-sigma modulator 52 further includes a multiplexer 66 and a summation node 68, at which a digital error signal, e2, received from the feedback circuit 56 is combined with a full-scale (m+q)-bit representation of the pulse density modulated signal v(t), where q>=0 and where, in many applications, q can be set equal to p. This brings the digital error signal e2 to a width of m+q bits or the full scale internal bit width of the delta-sigma modulator 52. The resulting (m+q)-bit signal e2', which is the quantized output (i.e., the pulse density modulated signal) plus the error, is provided to the input node 60.

The analog power stage 54 is coupled to the output of the delta-sigma modulator 52 and receives the pulse density modulated signal v(t) from the delta-sigma modulator 52. The power stage 54 amplifies the modulated signal v(t) to generate the analog signal v1(t). In this example, the power stage 54 includes level shifters and/or pre-drivers 70 that receive the pulse density modulated signal v(t) and whose output is connected to push-pull transistors 72 that output the analog signal v1(t).

The feedback circuit 56 is coupled to the delta-sigma modulator 52 and the analog power stage 54 to receive both the analog signal v1(t) and the pulse density modulated signal v(t). The feedback circuit 56 is configured to determine a digital error signal, e2, representative of a difference between the analog signal v1(t) and the modulated signal v(t). The feedback circuit 56 includes a difference node 80, a filter 82, and an ADC 84. The feedback circuit 56 provides the digital error signal e2, which is of a lower bit width, to the delta-sigma modulator 52, so that a full scale representation of the digital error signal e2 can be applied as feedback to the input signal u[n].

The difference node 80 receives the analog signal v1(t) and the pulse density modulated signal v(t) and outputs the difference between these signals (i.e., v1(t)−v(t)) to the filter 82.

The filter 82 integrates the difference between the analog signal v1(t) and the pulse density modulated signal v(t). The filter 82 can include an integrator, a low-pass filter, or similar.

The ADC 84 is a (m−r)-bit ADC, where r>0. The ADC 84 digitizes the integrated signal to obtain a (m−r)-bit digital error signal e2. The digital error signal e2 is advantageously of a bit width lower than the m-bit, (m+p)-bit, and (m+q)-bit signals operated on by the delta-sigma modulator 52. That is, if m=16, then the digital error signal e2 has fewer than 16 bits, such that (m-r) is between 6 and 13 bits, inclusive, for example. That is, r is set to between 3 and 10 or, within certain audio applications, r is preferably set to about 5 or 6. It is contemplated that smaller (i.e., lower bit width) digital error signals e2 will reduce power consumption. Power used by the ADC 84 increases with increasing bit width (resolution) of the digital error signal e2. Higher resolution of the ADC 84 can result in increased error rejection. Hence, the bit width of the digital error signal e2 can be selected to reduce power consumption to a level with a tolerable degree/risk of timing errors while providing suitable noise rejection to the amplified audio signal.

In addition, because the digital error signal e2 is fed back, rather than the full scale output signal, it is possible to have latency in the feedback path (N>=1). That is, an amount of delay in the ADC 84 and other components in its feedback path can be tolerated at a cost of reduced error attenuation. This can reduce the size, complexity, and cost of the ADC 84 and/or other components in the feedback path.

In some examples, the ADC 84 includes a pipeline ADC configured to provide a more-significant bit (e.g., the MSB) of the digital error signal e2 to the delta-sigma modulator 52 before providing a less-significant bit of the digital error signal e2 to the delta-sigma modulator 52. That is, one or more bits of higher significance can be provided relatively quickly so as to achieve as much of the quality gain as quickly as practical. The degree of delay in providing bits of lower significance to the delta-sigma modulator 52 can be selected based on implementation constraints. Benefits of using a pipeline ADC as the ADC 84 in the present invention include power efficiency and good resolution at the desired sampling rate.

The feedback circuit 56 can further include multiplier 86 in the feedback path from the analog power stage 54. The multiplier 86 has a scaling factor of "d", which can be selected to be equal to Vdd/Vpower, where Vdd is the voltage swing of the pulse density modulated signal v(t), and Vpower is the voltage swing of the analog signal v1(t).

Figure 6:
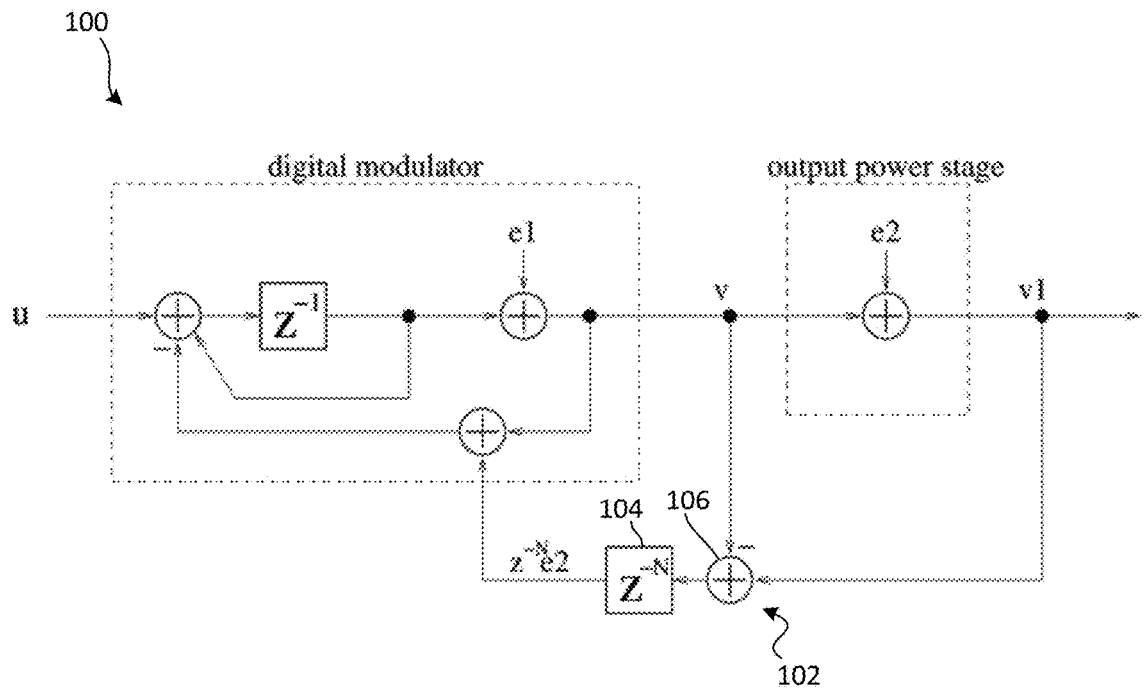
FIG. 6 is a conceptual diagram of the amplifier system modeled with a latency element.

FIGS. 5 and 6 illustrate how operational characteristics of amplifier systems according to the present invention can be modeled, depending on implementation specifics.

FIG. 6 shows an amplifier system 100. The amplifier system 100 is similar to the amplifier system 10 and the above description may be referenced. Redundant description is omitted for sake of clarity.

The amplifier system 100 includes a feedback circuit 102 that adds an N-cycle latency element 104 in the feedback path after the difference node 106.

For the amplifier system 100, the discrete time transfer function of the modulator output is as follows:

$$v[n]=z^{-1}u[n]+(1-z^{-1})e1[n]-(z^{-N-1})e2[n]$$

The discrete time transfer function of the power stage output is as follows:

$$v1[n]=(v[n]+e2[n])=z^{-1}u[n]+(1-z^{-1})e1[n]+(1-z^{-N-1})e2[n]$$

This results in an STF of $z^{-1}$. The NTF for quantization is $1-z^{-1}$. The NTF for the power stage is $$(1-z^{-N-1}) = \frac{z^{N+1}-1}{z^{N+1}}.$$

It should be apparent that the NTF for the power stage has a zero at $z^{N+1}=1$ and a pole at $z=0$, and that noise attenuation decreases as N increases.

Figure 7:
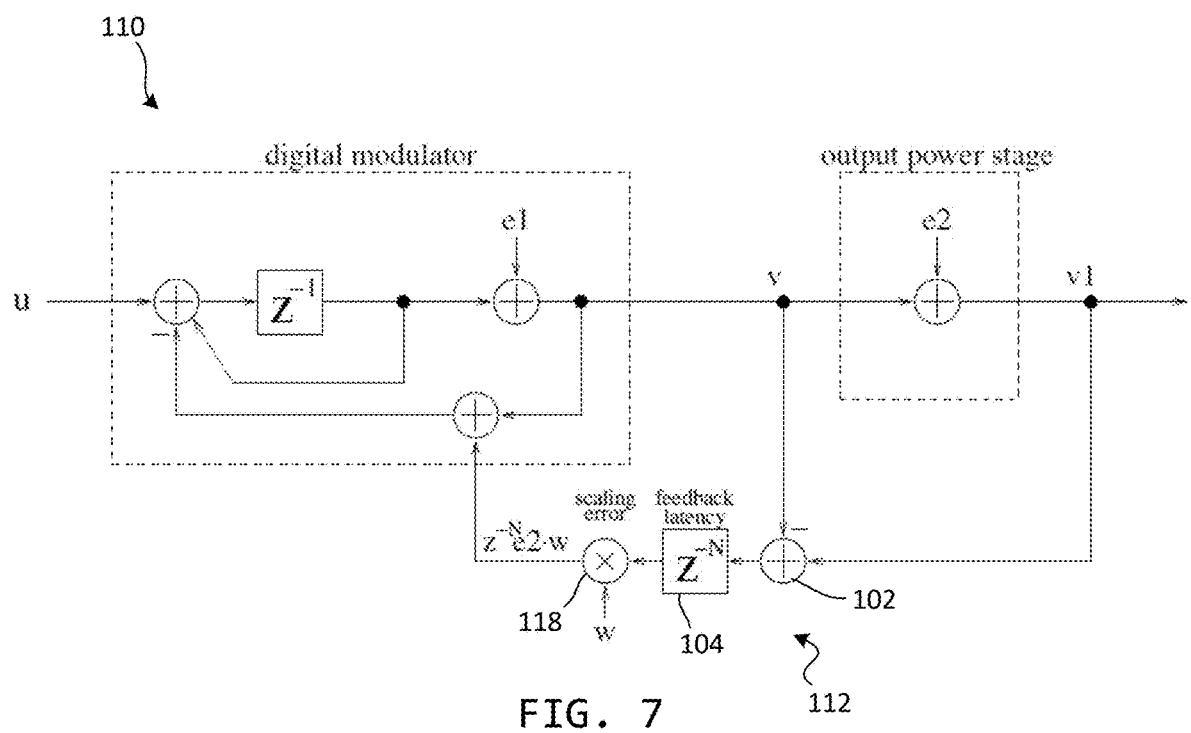
FIG. 7 is a conceptual diagram of the amplifier system modeled with a latency element and a scaling element.

FIG. 7 shows an amplifier system 110. The amplifier system 110 is similar to the amplifier system 100 and the above description may be referenced. Redundant description is omitted for sake of clarity.

The amplifier system 100 includes a feedback circuit 112 that adds a scaling element 118 in the feedback path after the N-cycle latency element 104 and the difference node 106. Scaling error in the feedback can be modeled with factor "w".

For the amplifier system 110, the discrete time transfer function of the modulator output is as follows:

$$v[n]=z^{-1}u[n]+(1-z^{-1})e1[n]-(wz^{-N-1})e2[n]$$

The discrete time transfer function of the power stage output is as follows:

$$v1[n]=(v[n]+e2[n])=z^{-1}u[n]+(1-z^{-1})e1[n]+(1-wz^{-N-1})e2[n]$$

This results in an STF of $z^{-1}$. The NTF for quantization is $1-z^{-1}$. The NTF for the power stage is $$(1-wz^{-N-1}) = \frac{z^{N+1}-w}{z^{N+1}}.$$

It should be apparent that the NTF for the power stage no longer has a zero at DC for values of "w" other than 1.

Figure 8:
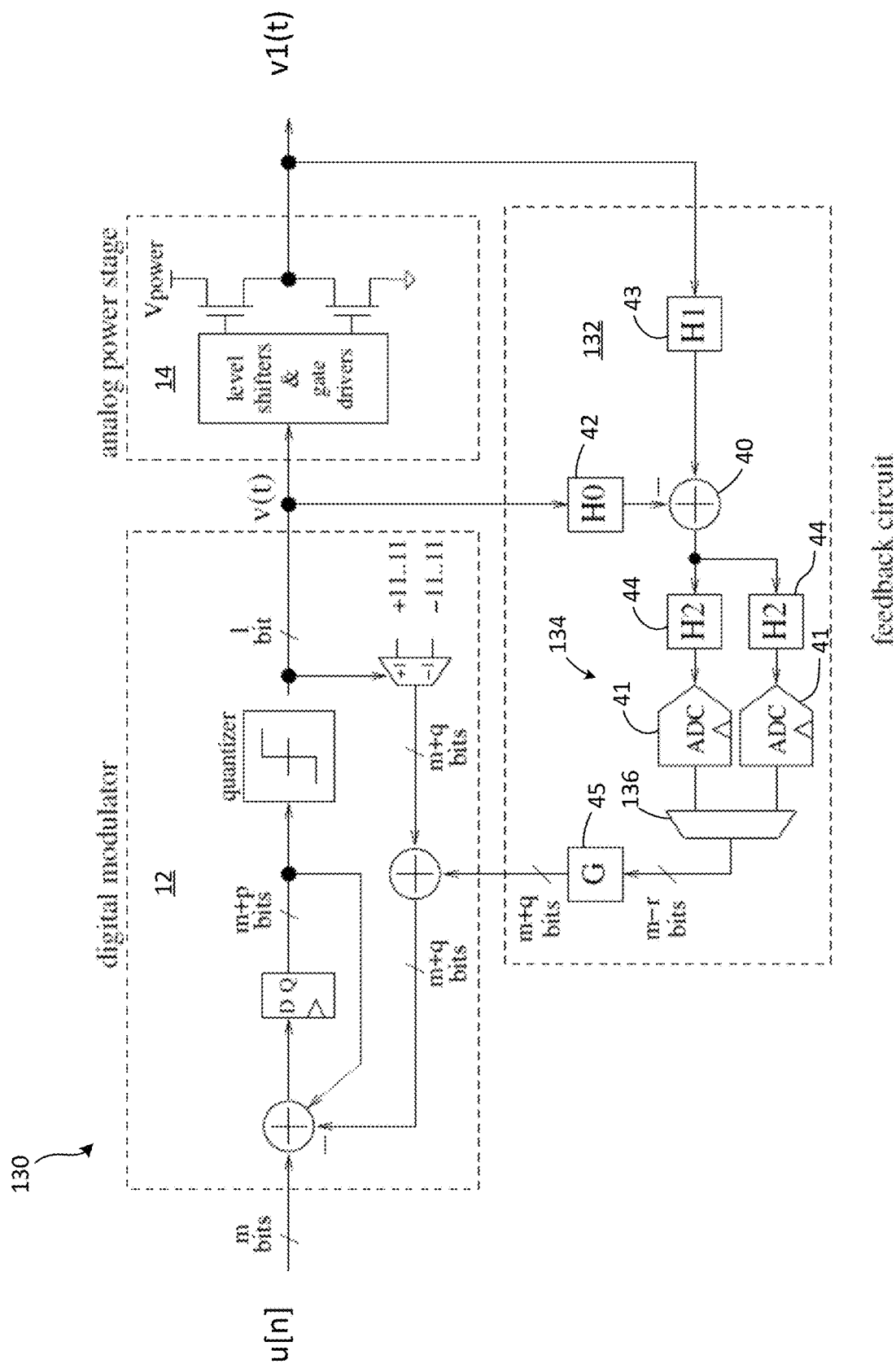
FIG. 8 is a schematic diagram of another amplifier system according to the present invention.

FIG. 8 shows an amplifier system 130. The amplifier system 130 is similar to the amplifier system 10 and the above description may be referenced. Redundant description is omitted for sake of clarity.

The amplifier system 130 includes a feedback circuit 132 that includes a multi-path ADC 134. The multi-path ADC 134 includes at least two parallel paths between the difference node 40 and the G block 45. Each path includes an H2 block 44 and an ADC 41, connected in series. The multi-path ADC 134 further includes a multiplexer 136 that connects the outputs of the ADCs 41 to the G block 41. The multiplexer 136 switches between the paths to take the processed and digitized difference signal from the selected path, to allow alternate use of H2 blocks: one block is reset while the other block is processing the difference signal.

Figure 9:
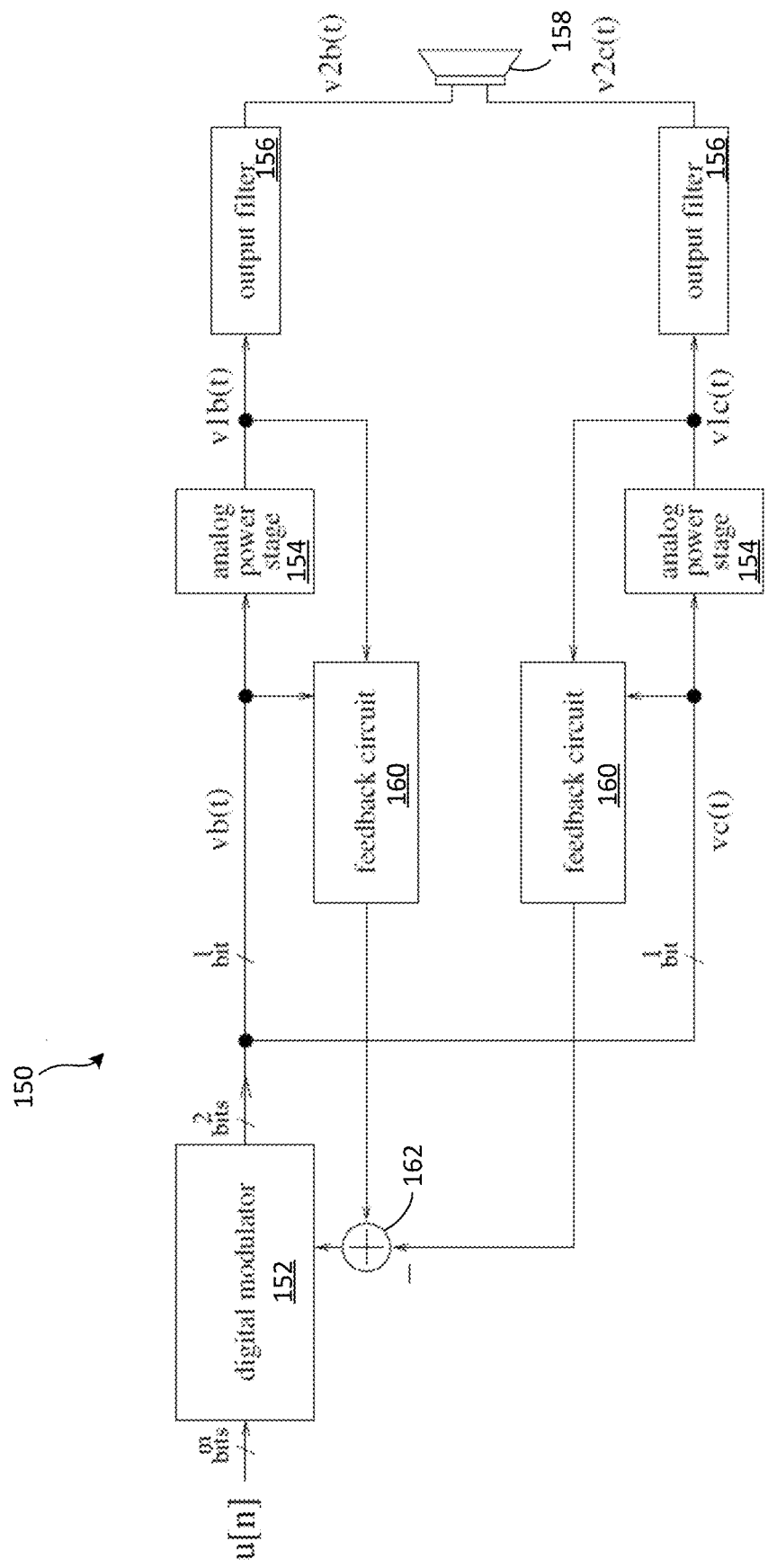
FIG. 9 is a schematic diagram of an audio system according to the present invention.

FIG. 9 shows an audio system 150 having a full-bridge architecture according to the present invention. The audio system 150 includes a delta-sigma modulator 152 configured for pulse density modulation, analog power stages 154, output filters 156, a speaker 158 or similar analog output device, and feedback circuits 160.

The delta-sigma modulator 152 can be the same or similar as any of the other modulators described herein. Output of the modulator 152 is two bits, with one bit being provided to each analog power stage 154. The two bits can be complementary or non-complimentary, depending on whether the modulator is being operated with 2-level or 3-level modulation.

The analog power stages 154 and output filters 156 are arranged in parallel paths or channels. Each analog power stage 154 can be the same or similar as any analog power stage discussed herein. Each output filter 156 can include a low-pass filter or similar. The output filters 156 connect to the speaker 158.

A feedback circuit 160 is provided to each of the paths. The feedback circuit 160 can be the same or similar as any feedback circuit described herein. The feedback circuit 160 in the first path takes as input the respective reference output vb(t) of the digital modulator 152 and the analog output v1b(t) of the respective analog power stage 154, and provides a feedback signal for the first path. Similarly, the feedback circuit 160 in the second path takes as input the respective reference output vc(t) of the digital modulator 152 and the analog output v1c(t) of the respective analog power stage 154, and provides a feedback signal for the second path.

A difference node 162 connects the feedback circuits 160 to the digital modulator 152. The difference node 162 combines (e.g., subtracts) the feedback signals of the first and second paths and provides a resulting feedback signal representative of the overall error to the digital modulator 152, for example, at a feedback node 36 (FIG. 2) in the digital modulator 152.

The full-bridge audio system 150 allows a doubling of output voltage swing, which increases potential output power by a factor of 4 over a half bridge architecture.

In other embodiments of the audio system 150 more than two power stages 154, filters 156, and feedback circuits 160 can be used.

In another embodiment of the audio system 150, the feedback circuits 160 omit ADCs and one ADC is provided after the feedback signals are combined at the difference node 162. That is, a single ADC is located between the difference node 162 and the modulator 152.

Figure 10:
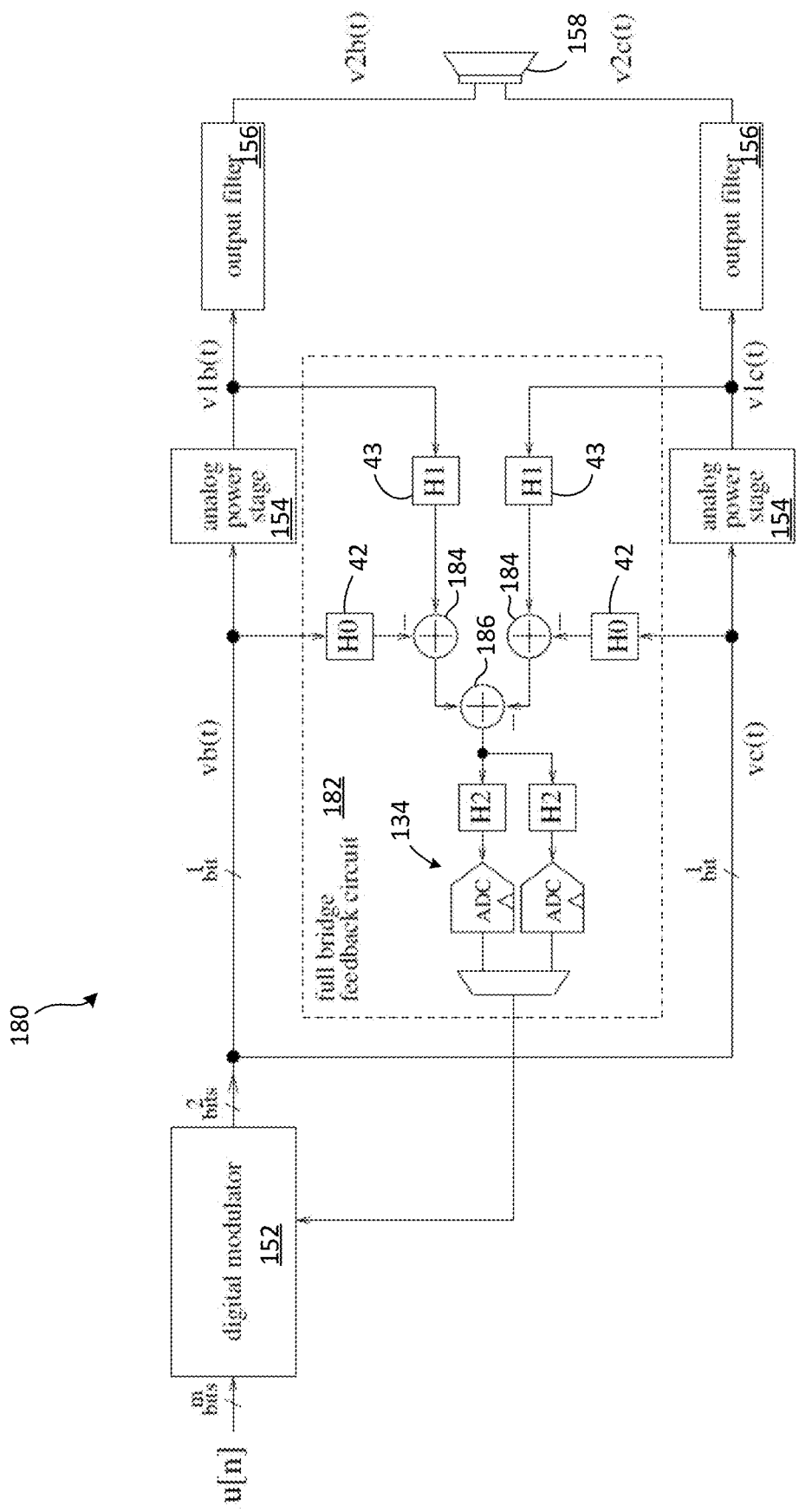
FIG. 10 is a schematic diagram of another audio system according to the present invention.

FIG. 10 shows an audio system 180. The audio system 180 is similar to the audio system 150 and the above description may be referenced. Redundant description is omitted for sake of clarity.

The audio system 180 includes one feedback circuit 182 that serves both paths or channels. The feedback circuit 182 includes H0 blocks 42, H1 blocks 43, and a multi-path ADC 134, as discussed above.

Each H0 block 42 takes as input the respective modulator output for the respective path. Each H1 block takes as input output of the respective analog power stage 154. The H0 and H1 blocks 42, 43 of each path have outputs combined at a respective difference node 184. The outputs of the difference nodes 184 are combined at another difference node 186, whose output is connected to the input of the multi-path ADC 134.

Hence, rather than the differences being computed digitally, as in the system 150, the system 180 determines the differences using analog circuitry before the ADC.

In other embodiments, the system 180 uses one H2 block 44 and one ADC 41, as shown in FIG. 2, instead of the multi-path ADC 134.

For sake of clarity it is noted that, in various embodiments, any number and combination of H0 block 42, H1 block 43, and H2 block 44 may be provided. Various embodiments may include one, two, or all of the H0 block 42, H1 block 43, and H2 block 44. Further, for sake of clarity, each of the H0 block 42, H1 block 43, and H2 block 44 may independently implement low-pass functionality. That is, any one, two, or three of the H0 block 42, H1 block 43, and H2 block 44 may implement a low-pass filter.

Although audio applications have been discussed above as examples for use of the present invention, it should be understood that the invention is also suitable for use in other applications. For instance, another application of the present invention is DC motor drivers.

The advantages of the present invention are numerous and should be apparent from the above detailed description. The error signal as feedback can improve output quality, while realizing advantages of class D architecture and digital pulse density modulation, such as reduced EMI, design portability, and ease of testing. Required clock frequency is reduced. Regarding portability, the invention allows for highly digital designs that can be reused in various applications with few changes needed. Testing needs and costs can be reduced, in that designs implementing the present invention can use well established digital testing workflows rather than customized testing processes, as is often needed in highly analog designs. Further, power needs can be reduced by selecting a bit width for the error signal that is lower than the bit width of the modulated signal.

While the foregoing provides certain non-limiting examples, it should be understood that combinations, subsets, and variations of the foregoing are contemplated. The monopoly sought is defined by the claims.

What is claimed is:

1. An audio amplifier system comprising:
    a delta-sigma modulator configured to receive an in-bit digital audio input signal and generate a pulse density modulated signal based on the ni-bit digital audio input signal;
    an analog power stage coupled to the delta-sigma modulator to receive the pulse density modulated signal and amplify the pulse density modulated signal to generate an amplified pulse density modulated signal; and
    a feedback circuit coupled to the delta-sigma modulator and the analog power stage, the feedback circuit configured to receive the amplified pulse density modulated signal and the pulse density modulated signal and to determine a digital error signal representative of a difference between the amplified pulse density modulated signal and the pulse density modulated signal, the feedback circuit further configured to provide the digital error signal to the delta-sigma modulator for applying the digital error signal to a representation of the in-bit digital audio input signal;
    wherein the feedback circuit is further configured to perform transfer function on the difference between the amplified pulse density modulated signal and the pulse density modulated signal and to convert a resulting difference into a digital signal so as to obtain the digital error signal;
    wherein the feedback circuit comprises a difference node coupled to the delta-sigma modulator and the analog power stage, the difference node for determining the difference between the amplified pulse density modulated signal and the pulse density modulated signal;
    wherein the feedback circuit further comprises a filter coupled to the difference node, the filter for integrating the difference between the amplified pulse density modulated signal and the pulse density modulated signal.

2. The system of claim 1, wherein the feedback circuit is further configured to perform another transfer function on the amplified pulse density modulated signal.

3. The system of claim 1, wherein the feedback circuit is further configured to perform another transfer function on the pulse density modulated signal.

4. The system of claim 1, wherein the feedback circuit further comprises an analog-to-digital converter coupled to the filter, the analog-to-digital converter for converting an integrated difference between the amplified pulse density modulated signal and the pulse density modulated signal into the digital error signal.

5. The system of claim 4, wherein the analog-to-digital converter comprises an analog-to-digital converter configured to provide a more-significant bit of the digital error signal to the delta-sigma modulator before providing a less-significant bit of the digital error signal to the delta-sigma modulator.

6. The system of claim 1, wherein the digital error signal is an (m−r)-bit digital signal, where r>0.

7. The system of claim 6, further comprising a summation node configured to sum the digital error signal with an (m+q)-bit full-scale signal generated from the pulse density modulated signal, where q>=0, to add the digitized error signal to the pulse density modulated signal that is fed back within the delta-sigma modulator.

8. The system of claim 6, wherein in is 16 and r is 5 or 6.

9. The system of claim 1, wherein the delta-sigma modulator comprises a difference node for subtracting a representation of the pulse density modulated signal plus the digital error signal from the m-bit digital audio input signal.

10. The system of claim 9, wherein the difference node is part of an internal feedback loop of the delta-sigma modulator.

11. A process for amplifying an in-bit digital audio input signal, the process comprising:
using a delta-sigma modulator to generate a pulse density modulated signal based on the m-bit digital audio input signal, including applying a digital error signal to a representation of the m-bit digital audio input signal;
amplifying the pulse density modulated signal to generate an amplified pulse density modulated signal;
determining the digital error signal by applying a transfer function to a difference between the amplified pulse density modulated signal and the pulse density modulated signal, and further by converting an integrated difference between the amplified pulse density modulated signal and the pulse density modulated signal into the digital error signal; and
providing the digital error signal to the delta-sigma modulator in a feedback path.

12. The process of claim 11, further comprising performing another transfer function on the amplified pulse density modulated signal.

13. The process of claim 11, further comprising performing another transfer function on the pulse density modulated signal.

14. The process of claim 11, further comprising providing a more-significant bit of the digital error signal to the delta-sigma modulator before providing a less-significant bit of the digital error signal to the delta-sigma modulator.

15. The process of claim 11, wherein the digital error signal is an (m−r)-bit digital signal, where r>0.

16. The process of claim 15, further comprising combining the digital error signal with an (m+q)-bit full-scale signal generated from the pulse density modulated signal, where q>=0, to add the digitized error signal to the pulse density modulated signal that is fed back within the delta-sigma modulator.

17. The process of claim 15, wherein m is 16 and r is 5 or 6.

18. The process of claim 11, further comprising subtracting a representation of the pulse density modulated signal plus the digital error signal from the m-bit digital audio input signal.

19. An audio amplifier system comprising:
a delta-sigma modulator configured to receive an in-bit digital audio input signal and generate a pulse density modulated signal based on the in-bit digital audio input signal;
an analog power stage coupled to the delta-sigma modulator to receive the pulse density modulated signal and amplify the pulse density modulated signal to generate an amplified pulse density modulated signal;
a feedback circuit coupled to the delta-sigma modulator and the analog power stage, the feedback circuit configured to receive the amplified pulse density, modulated signal and the pulse density modulated signal and to determine a digital error signal representative of a difference between the amplified pulse density modulated signal and the pulse density modulated signal, wherein the digital error signal is an (m−r)-bit digital signal, where r>0, the feedback circuit further configured to provide the digital error signal to the delta-sigma modulator for applying the digital error signal to a representation of the in-bit digital audio input signal; and
a summation node configured to sum the digital error signal with an (m+q)-bit full-scale signal generated from the pulse density modulated signal, where q>=0, to add the digitized error signal to the pulse density modulated signal that is fed back within the delta-sigma modulator;
wherein the feedback circuit is further configured to perform a transfer function on the difference between the amplified pulse density modulated signal and the pulse density modulated signal and to convert a resulting difference into a digital signal so as to obtain the digital error signal.

20. The system of claim 19, wherein in is 16 and r is 5 or 6.

21. An audio amplifier system comprising:
a delta-sigma modulator configured to receive an in-bit digital audio input signal and generate a pulse density modulated signal based on the ni-bit digital audio input signal;
an analog power stage coupled to the delta-sigma modulator to receive the pulse density modulated signal and amplify the pulse density modulated signal to generate an amplified pulse density modulated signal; and
a feedback circuit coupled to the delta-sigma modulator and the analog power stage, the feedback circuit configured to receive the amplified pulse density modulated signal and the pulse density modulated signal and to determine a digital error signal representative of a difference between the amplified pulse density modulated signal and the pulse density modulated signal, the feedback circuit further configured to provide the digital error signal to the delta-sigma modulator for applying the digital error signal to a representation of the in-bit digital audio input signal;
wherein the feedback circuit is further configured to perform a transfer function on the difference between the amplified pulse density modulated signal and the pulse density modulated signal and to convert a resulting difference into a digital signal so as to obtain the digital error signal;
wherein the delta-sigma modulator comprises a difference node for subtracting a representation of the pulse density modulated signal plus the digital error signal from the in-bit digital audio input signal.

22. The system of claim 21, wherein the difference node is part of an internal feedback loop of the delta-sigma modulator.

23. A process for amplifying an in-bit digital audio input signal, the process comprising:
using a delta-sigma modulator to generate a pulse density modulated signal based on the in-bit digital audio input signal, including applying a digital error signal to a representation of the in-bit digital audio input signal;

amplifying the pulse density modulated signal to generate an amplified pulse density modulated signal;

determining the digital error signal by applying a transfer function to a difference between the amplified pulse density modulated signal and the pulse density modulated signal; and providing the digital error signal to the delta-sigma modulator in a feedback path, including providing a more-significant bit of the digital error signal to the delta-sigma modulator before providing a less-significant bit of the digital error signal to the delta-sigma modulator.

24. A process for amplifying an in-bit digital audio input signal, the process comprising:

using a delta-sigma modulator to generate a pulse density modulated signal based on the in-bit digital audio input signal, including applying a digital error signal to a representation of the in-bit digital audio input signal, wherein the digital error signal is an (m−r)-bit digital signal, where r>0;

amplifying the pulse density modulated signal to generate an amplified pulse density modulated signal;

determining the digital error signal by applying a transfer function to a difference between the amplified pulse density modulated signal and the pulse density modulated signal;

providing the digital error signal to the delta-sigma modulator in a feedback path; and combining the digital error signal with an (m+q)-bit full-scale signal generated from the pulse density modulated signal, where q>=0, to add the digitized error signal to the pulse density modulated signal that is fed back within the delta-sigma modulator.

25. The process of claim 24, wherein m is 16 and r is 5 or 6.

* * * * *